United States Patent [19]

Huston et al.

[11] Patent Number: 4,498,954

[45] Date of Patent: Feb. 12, 1985

[54] SELECTIVE PROCESS FOR ETCHING CHROMIUM

[75] Inventors: Dennis L. Huston, Crystal; Vahram S. Kardashian, Plymouth, both of Minn.; Arthur H. Mones, Oak Park, Ill.

[73] Assignee: Honeywell Inc., Minneapolis, Minn.

[21] Appl. No.: 597,952

[22] Filed: Apr. 9, 1984

[51] Int. Cl.³ .............................. C23F 1/02; B44C 1/22; C03C 15/00; C03C 25/06

[52] U.S. Cl. .................................... 156/651; 156/652; 156/656; 156/659.1; 252/79.2; 252/79.4

[58] Field of Search ............................ 252/79.2, 79.4; 156/640, 651, 652, 656, 659.1, 664, 639, 905; 134/3, 27, 28, 41; 430/313, 316, 318

[56] References Cited

U.S. PATENT DOCUMENTS 3,930,857  1/1976  Bendz et al. ................... 156/651 X
4,160,691  7/1979  Abolafia et al. ............... 156/656 X Primary Examiner—William A. Powell
Attorney, Agent, or Firm—Stephen W. Buckingham

[57] ABSTRACT

A selective method of etching chromium is described. In the present invention an etching cycle, including etching with a first solution including potassium permanganate and then with a second solution including oxalic acid is defined. Such a cycle will remove a thin layer of chromium and may be required to be performed a plurality of times to complete the etching process.

14 Claims, 2 Drawing Figures

SELECTIVE PROCESS FOR ETCHING CHROMIUM

The present application relates to a method for etching chromium.

BACKGROUND OF THE INVENTION

In the field of semiconductor integrated circuits an electrical conductor pattern is often placed on a substrate. Such substrates may be integrated circuits themselves or may be packaging substrates on which one or more integrated circuit chips may be mounted. The conductor patterns will then provide electrical interconnections between various such circuit portions on a chip, between integrated circuits mounted on a single packaging substrate, and between such chips and external circuitry. The metalization used to form such a conductor pattern often will include chromium, either alone or in conjunction with other metals. A commonly used structure places a layer of chromium adjacent to the substrate, a layer of copper over the chromium, and a second layer of chromium over the copper. In such a structure, the first layer of chromium is used because it will adhere well to typical substrates. The layer of copper is provided for its superior electrical conductivity, and the second layer of chromium protects the copper and presents a less reactive exposed surface or acts as a solder dam.

Such metalized substrates are commonly prepared by applying a relatively uniform metalization layer on a major surface of the substrate. A layer of photo-resist is then applied over the metalization layer. The photo-resist is exposed and developed leaving a resist layer covering those portions of the metalization to be retained, but leaving those portions of the substrate to be removed exposed. The exposed portion of the metalization layer is then brought in contact with an etching solution. The etching solution will remove those portions of the metalization layer lying beneath the exposed surface. When the etching is complete, only those portions of the metalization lying beneath the developed photo-resist will be retained. These portions form the desired electrically conductive network.

Because chromium is more difficult to etch than many other metals, some problems arise when chromium is included in the metalization. Such etchants used to etch chromium also tend to attack some commonly used photo-resist materials. Therefore, the choice of resists may be severely limited if such an etchant is to be used. Another problem arising with some etchants lies in the fact that they only etch chromium effectively when it is in contact with copper. Such etchants will not work effectively if chromium is used alone, and may even incompletely etch chromium in the Cr/Cu/Cr structure described above. Some prior art etchants will tend to etch chromium rapidly in a lateral direction resulting in undercutting in the chromium layer. Furthermore, some of the etchants will etch copper at a higher rate than chromium, thereby aggravating the undercutting problem. Even those etchants which do not etch copper more rapidly than chromium will often etch copper to some extent. Therefore a method of selectively etching chromium is desirable.

BRIEF DESCRIPTION OF THE INVENTION

The present invention uses a two solution process to etch a chromium layer. The first solution is a potassium permanganate ($KMnO_4$) solution. The second bath includes oxalic acid ($HO_2CCO_2H$). In practicing the invention the chromium to be etched is exposed to the first solution for a first period of time. The chromium surface is then thoroughly rinsed and exposed to the second solution for a second period of time. The chromium is then thoroughly rinsed a second time. The process may be repeated until etching is complete. The present invention is particularly effective at etching thin films, such as those having a thickness of 1500 to 2000 angstroms, although greater thicknesses may be etched. If a thicker film is to be etched, more repetitions of the cycle will be required.

DETAILED DESCRIPTION OF THE PREFERRED EMBODIMENT

In the description of the preferred embodiment the method of the invention will be assumed to be used to produce an electrical conductor network on a substrate. Those skilled in the art will perceive, however, that the invention may be used in any situation requiring the selective etching of chromium, particularly when the chromium is in the form of a thin film.

Figure 1:
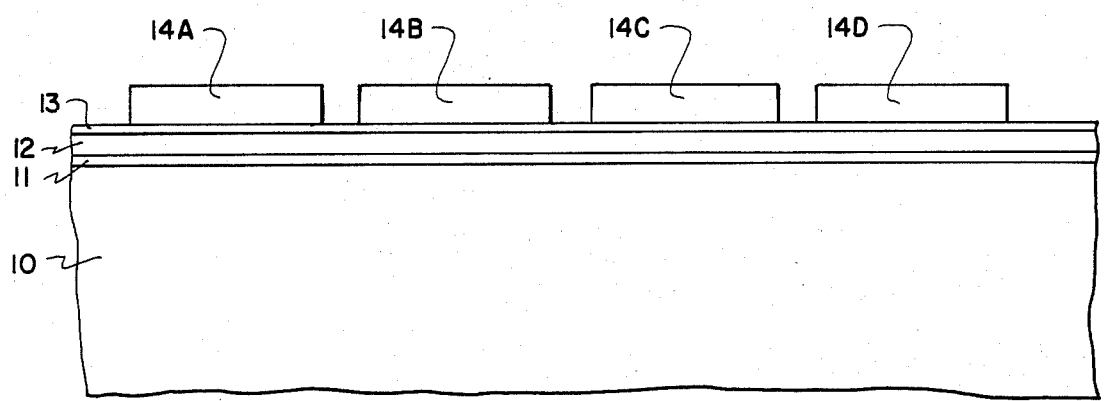
FIG. 1 is a cross sectional drawing of a substrate with a three layer metalization and a photo-resist pattern.

FIG. 1 is a cross sectional drawing of a substrate/-metalization assembly prior to etching. Shown therein is a substrate 10, typically of a ceramic material, if substrate 10 is a packaging substrate. As explained above, substrate 10 could also be of a semiconductor material, or any other substrate which will support a chromium film. Also shown is a three layer metalization. Typically metalization layer 11 would be of chromium, layer 12 of copper, and layer 13 of chromium. As explained previously, some prior art chromium etching procedures require the presence of a copper layer for the chromium to be etched. With the method of the present invention copper is not required. Copper layer 12 is included, however, because the use of copper is preferred in order to provide higher electrical conductivity in the final product. FIG. 1 also shows a developed photo-resist pattern 14A, 14B, 14C and 14D.

The etching of the present invention is performed by the use of two different solutions. The first solution includes potassium permanganate and water. Preferably the solution may be slightly acidified. Tests have shown hydrochloric acid (HCl) to work well to provide the acidification. In a preferred embodiment the first solution is formed by dissolving potassium permanganate in water in a ratio of 90 grams of potassium permanganate per liter of water. Concentrated hydrochloric acid is added to the solution until the pH is brought to a value no greater than 6. Tests indicate that good etching may be performed with a pH of approximately 2.3.

The second solution includes oxalic acid and water. In a preferred embodiment, the second solution is prepared by dissolving oxalic acid in water in a ratio of 25 grams of oxalic acid per liter of water.

Successful etching can be performed at a wide range of temperatures. A temperature of 42° C. has been shown to produce good results. In practice etching is performed by bringing the structure of FIG. 1 into contact with the first solution. In the preferred embodiment this is done by immersing the substrate with metalization and etching mask in the solution. Other known methods for performing a wet chemical etch may be used, however. For example, the etching solution may be sprayed on the surface of the chromium to be etched. The chromium layer to be etched is left in contact with the first etching solution for a period of time, which could be, for example, approximately one minute.

After sufficient exposure to the first solution the chromium surface is thoroughly rinsed to remove the potassium permanganate solution. Preferably the rinse is formed with deionized water.

After thorough rinsing, the surface being etched is exposed to the second solution. As in the case of the exposure to the first solution, the surface may be exposed to the second solution by immersion, spraying, or any other technique which will bring the surface into contact with the etching solution. The oxalic acid solution remains in contact with the surface for a second period of time, which could be, for example, approximately 15 seconds.

After the oxalic acid etch the surface is again thoroughly rinsed, preferably with deionized water.

When the above process, exposure to potassium permanganate solution, rinse, exposure to oxalic acid solution, rinse, is performed, a thin layer of chromium will be removed. Typically a plurality of such cycles are required to completely etch a chromium layer. Approximately 10 to 12 of these cycles will completely remove a layer of chromium 1,500 angstroms thick if the etch is performed at room temperature. Fewer such cycles are required at higher temperatures.

Figure 2:
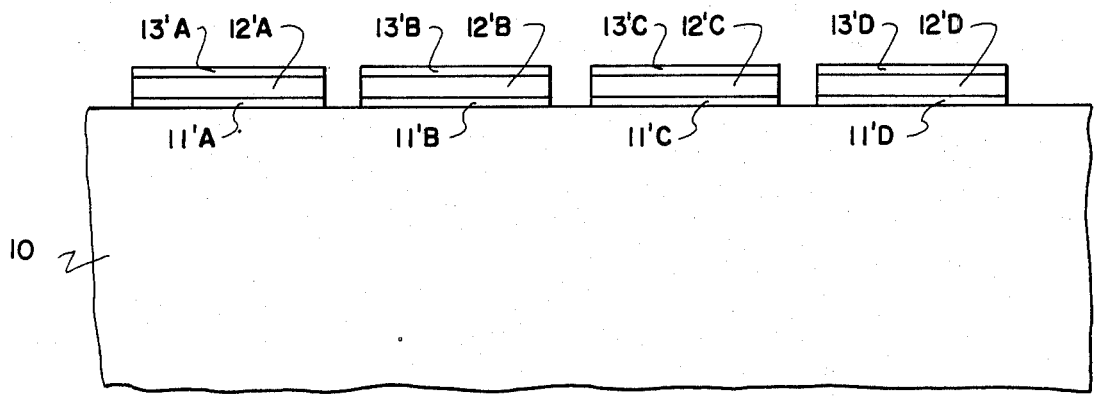
FIG. 2 is a cross sectional drawing of the substrate and metalization of FIG. 1 following etching and stripping of the photo resist.

The process described is effective for etching chromium but will not significantly etch copper. In the structure of FIG. 1, and in many practical embodiments, a layer of copper is placed between two layers of chromium. The method of the invention is used to etch chromium layer 13. After those portions of chromium layer 13 which are not protected by the etching mask, such as photo-resist 14A, 14B, 14C, and 14D of FIG. 1, are completly removed a different procedure must be used to etch copper layer 12. Preferably the copper etchant should be one which will not significantly etch chromium. Following the etch of the copper the inventive method is used to etch chromium layer 11. Following stripping of photo-resist 14A, 14B, 14C, and 14D the structure of FIG. 2 remains.

The embodiments of the invention in which an exclusive property of right is claimed are defined as follows:

1. A method of etching chromium, said method including a cycle of steps, said cycle comprising the steps of:
   contacting said chromium with a first solution, said first solution including potassium permanganate;
   thoroughly rinsing said chromium in order to remove said first solution;
   contacting said chromium with a second solution, said second solution including oxalic acid; and
   thoroughly rinsing said chromium layer in order to remove said second solution.

2. The method of claim 1 wherein said cycle is repeated a plurality of time.

3. The method of claim 1 wherein said first solution further includes an acid.

4. The method of claim 3 wherein said first solution is acidic.

5. The method of claim 4 wherein said first solution has a pH of approximately 2.3.

6. The method of claim 5 wherein said cycle is performed a plurality of times.

7. The method of claim 3 wherein said acid is hydrocholric acid.

8. The method of claim 7 wherein said first solution is acidic.

9. The method of claim 8 wherein said first solution has a PH of approximately 2.3.

10. The method of claim 9 wherein said cycle is performed a plurality of times.

11. The method of claim 1 wherein said chromium layer is contacted with each of said first and second solutions by immersion therein.

12. The method of claim 11 wherein said first solution further includes an acid.

13. The method of claim 12 wherein said acid is hydrochloric acid.

14. The method of claim 13 wherein said cycle is performed a plurality of times.

* * * * *